United States Patent [19]
Johnson et al.

[11] 3,946,381
[45] Mar. 23, 1976

[54] GRAPHIC SYSTEM APPARATUS UTILIZING PLASMA DISPLAY/MEMORY DEVICES WITH DIRECT ELECTRICAL READ-OUT

[75] Inventors: Roger L. Johnson, Monticello; Larry F. Weber, Urbana, both of Ill.

[73] Assignee: National Science Foundation, Washington, D.C.

[22] Filed: May 14, 1973

[21] Appl. No.: 359,638

Related U.S. Application Data

[63] Continuation-in-part of Ser. No. 259,989, June 5, 1972, abandoned.

[52] U.S. Cl. ...... 340/173 R; 313/201; 315/169 TV; 340/324 R; 340/173 PL
[51] Int. Cl.² .......................................... G11C 11/28
[58] Field of Search ....... 340/173 PL, 324; 313/201; 315/169 TV

[56] References Cited
UNITED STATES PATENTS

| | | |
|---|---|---|
| 2,889,538 | 6/1959 | Geisler .......................... 340/173 R |
| 3,198,980 | 8/1965 | Martin .......................... 340/173 PL |
| 3,559,190 | 1/1971 | Bitzer .......................... 340/173 PL |
| 3,573,757 | 4/1971 | Adams .......................... 340/173 PL |
| 3,761,897 | 9/1973 | Tech .......................... 340/173 PL |
| 3,796,997 | 3/1974 | Johnson .......................... 340/173 PL |

*Primary Examiner*—Terrell W. Fears
*Attorney, Agent, or Firm*—Merriam, Marshall, Shapiro & Klose

[57] ABSTRACT

Method and apparatus for electrically interrogating gaseous discharge cells in a plasma panel to sense the state of said cells by selectively coupling a sensing impedance element for detecting the presence of a discharge current associated with cells having information. Graphic systems using electrical interrogation of gaseous discharge cells in a plasma panel to provide image editing and/or image transfer.

49 Claims, 20 Drawing Figures

VOLTAGE WAVEFORMS APPEARING AT THE PANEL ELECTRODES

GRAPHIC SYSTEM APPARATUS UTILIZING PLASMA DISPLAY/MEMORY DEVICES WITH DIRECT ELECTRICAL READ-OUT

This is a continuation-in-part application of a copending application Ser. No. 259,989 filed June 5, 1972 and now abandoned.

This invention relates to plasma display panels and more particularly to methods and apparatus for electronically extracting or reading-out information from a plasma panel.

The plasma panel is a two dimensional array of light emitting gas discharge elements that exhibits inherent memory. This type of plasma panel has been previously described in U.S. Pat. No. 3,559,190, issued Jan. 26, 1971, on an application of D. L. Bitzer, H. G. Slottow and R. H. Willson, entitled "Gaseous Display and Memory Apparatus", U.S. Ser. No. 613,693, filed Dec. 22, 1966, assigned to the same assignee as here. The plasma panel described in the aforementioned patent comprises a plurality of discharge cells having associated electrodes for discharging the gaseous medium within selected cells and forming corresponding cell wall charges, the presence or absence of wall charges conveying the desired display information. The plasma panel is normally termed a "plasma display panel" although it is also useful as an information storage or memory panel, with or without its display capability.

In U.S. Pat. No. 3,559,190 there is disclosed optical read-out techniques for extracting information from an array of plasma display elements. It is also mentioned that in addition to light detecting means, suitable electrical interrogation techniques may be employed to detect the presence of cell wall charges (Column 13, lines 48–50). Brief mention of possible electrical interrogation techniques is also given in the following:

1. D. L. Bitzer and H. G. Slottow, "Principles and Applications of the Plasma Display Panel," Proceedings of the O.A.R. Research Applications Conference, Office of Aerospace Research, Arlington, Virginia, March 1968.
2. D. L. Bitzer, H. G. Slottow, "Principles and Applications of the Plasma Display Panel," Proceedings of the 1968 Microelectronics Symposium, IEEE, St. Louis, Missouri, 1968.
3. R. L. Johnson, "The Application of the Plasma Display Technique to Computer Memory Systems," Ph.D. Thesis, University of Illinois, Urbana, Illinois, 1970.

We have now developed several novel and useful electrical interrogation techniques. From a fundamental viewpoint, there exist two primary observables (i.e., phenomena which can be observed and measured external to a plasma display element) that can be used to determine the state of the element: (1) the light pulse sequences which characterize each state; and (2) the external current pulse sequences which are directly proportional to the internal discharge current pulses that characterize each state. In both cases, the identity of a state is determined by the phrase relationship between the observed activity and the sustain/control voltage waveform. In addition to the primary observables just mentioned, there are other internal phenomena (e.g., field strength, excited particle populations, etc.) whose detection depend upon the realization of specialized element fabrication techniques and measurement equipment.

Discharge current read-out schemes are similar to optical read-out schemes in that the occurrence of discharge current pulses corresponds to the light pulses. As a result, the read-out logic operations which follow current detection are similar to those in the optical read-out case. The difficult task is to detect the occurrence of the discharge current pulse in the midst of the large amplitude capacitive charging currents and the associated electrical noise signals.

SUMMARY OF THE INVENTION

In accordance with the present invention a method and apparatus are provided for electrically interrogating a plasma panel. In a specific embodiment of the invention apparatus is provided for the direct electrical read-out of a 4 × 4 plasma panel in association with the other required address, erase and sustain functions.

A graphic system is provided using electrical interrogation for the direct electrical read-out of a plasma panel in image editing and/or image transfer.

DETAILED DESCRIPTION

Figure 1:
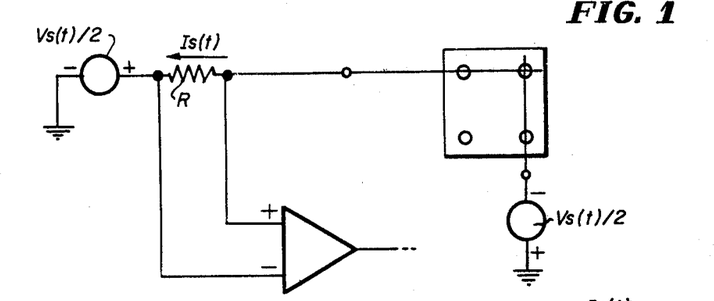
FIGS. 1 and 2 illustrate general techniques useful in understanding the present invention.
Figure 2:
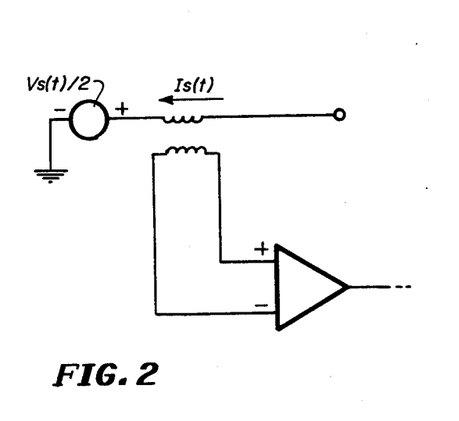

The detection of discharge current pulses is usually accomplished in two ways: (1) the detection of a differential voltage across a series resistance as shown in FIG. 1; and (2) the detection of a voltage induced by the discharge current in a magnetic sensor as shown in

FIG. 2.

Read-out schemes which use discharge current detection lend themselves readily to parallel output configurations because of the natural electrical isolation that can be achieved in the sensing circuit design. The dimension of the parallel output word would depend primarily on the output data rate and on the cost of sensing circuits.

Discharge current readout schemes depend upon the ability to detect the occurrence or non-occurrence of the discharge current of a single cell that is being interrogated. As stated, the detection of these discharge current pulses can be accomplished in two ways: (1) the detection of a differential voltage developed across a series resistance by the discharge current; and (2) the detection of a voltage induced by the discharge current in a magnetic-core sensor.

Figure 3:
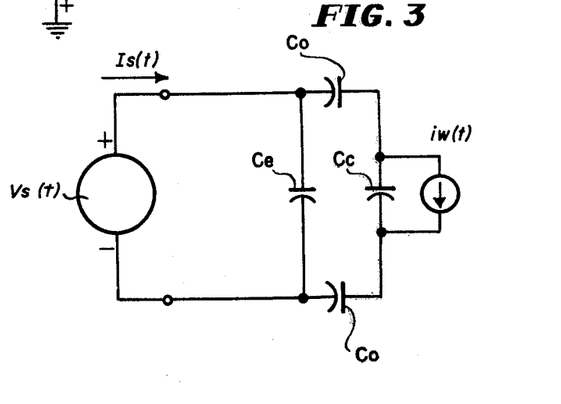
FIG. 3 illustrates an equivalent circuit representing a single cell in an array with inter-electrode capacitance taken into account.

In order to discuss these schemes in detail, it is necessary to describe an equivalent circuit model which adequately represents a single cell in an array. Consider a single plasma display element being driven by an ideal voltage source as shown in FIG. 3. The equivalent circuit shown in FIG. 3 is a first order, lumped parameter approximation of this element's electrical properties. The internal dependent current source provides an approximate representation of the charge flow which results from gas discharge activity in the cavity. The capacitive properties of the element are represented by a series of linear capacitors labeled $C_o$, $C_c$, and $C_o$ which correspond to the equivalent capacitances of the three dielectric layers. When a single cell is placed into an array of similar elements, an additional inter-electrode capacitance $C_e$ must be added as shown in FIG. 3. For a conventional sized panel (e.g., 128 × 128) $C_e$ is of the order of 10 pf while $C_o$ and $C_c$, both of which depend on various element parameters, are of the order of 0.1 pf and 0.01 pf respectively. Since $C_o >> C_c$ and $C_e >> C_c$ the circuit in FIG. 3 can be approximated as a capacitance of about 10 pf in parallel with a current source representing the gas discharge.

Figure 4:
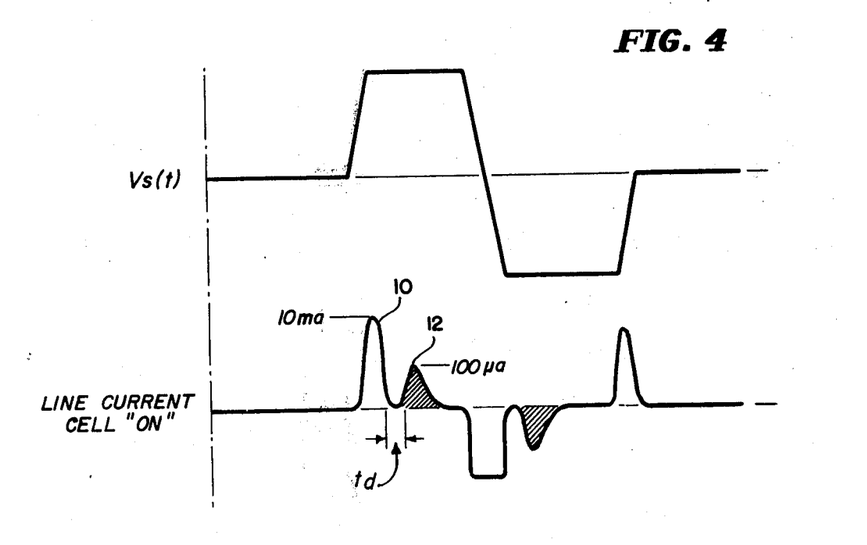
FIG. 4 illustrates the line current of an "on" cell.

When the equivalent circuit model is driven with a low impedance square wave voltage source, the current which flows through the source loop has two components. First, there is a current pulse 10 which corresponds to the charging and discharging of $C_e$, and second there is a current pulse 12 that is directly proportional to $i_w(t)$ the discharge current as illustrated in FIG. 4.

In order to electrically sense the state of a single cell, one must observe the occurrence or non-occurrence of the discharge current pulse 12 at a prescribed time in the sustain cycle. Although in some types of plasma display cells the capacitive charging current overlaps the discharge current $i_w(t)$ in time, other panels exhibit time separation of the capacitive current pulse 10 and the discharge current pulse 12 when driven with a square wave sustain voltage similar to that shown in FIG. 4. We have particularly found this time separation when utilizing plasma panels manufactured by Owens-Illinois, Inc. This delayed discharge characteristic is extremely important to the realization of simple current sensing circuits. The advantage comes from not having to build complex subtracting circuits which will extract the relatively small discharge current from the large capacitive charging current. Instead, since the two currents are separated in time, the sensor can be allowed to sample the current only during the discharge time interval. In presently available plasma panels, the discharge current pulse 12 has a peak amplitude of 0.1 ma and a pulse width of approximately 1 to 2 microseconds.

Some experimental read-out configurations have been constructed in order to determine the feasibility of the direct electrical read-out scheme suggested in FIG. 2. The specific embodiment of the invention hereinafter described, however, relates to discharge current sensing by impedance insertion. The specific embodiment illustration is not to be taken as so limiting the invention, since those skilled in the art may apply the teachings herein to other embodiments within the principles of this invention.

FIG. 1 suggests a circuit used to detect the discharge current 12 of a selected cell by observing the differential voltage developed across R due to the discharge current. Again, it will be assumed that the capacitive charging current is separated in time from the discharge current. The resistance R must be of sufficient magnitude so that the voltage drop due to the discharge current is large enough to be easily detected. However, R must also be small enough so that the voltage drop across it is less than 1% of the sustain voltage when all of the cells in the line are firing during the sustain interval and small enough so that it does not reduce appreciably the rise time of the applied voltage pulse. In the case of a 128 × 128 line panel, the worst-case peak discharge current which occurs is (0.1 ma/cell) × (128 cells) = 12.8 ma. In this case R must be less than 100 ohms in order to assure a maximum voltage drop of 1 volt across R during the sustain interval. If R is set at 100 ohms, then the current of a single interrogated cell will develop a voltage of 10 mv. Although this voltage is detectable with a sensitive amplifier, the various noise factors may make this very difficult and cumbersome. A more desirable approach is to insert a large resistance during the interrogation interval and remove it at all other times. If, during the discharge, R is infinite, then the discharge current will flow through $C_e$ and thus change the voltage across it by an amount $V = 1/C_e \int i_w(t)dt$. This value represents that absolute maximum differential voltage that can be obtained from a single cell. In the panels manufactured by Owens-Illinois, Inc. this may be as large as 1 volt.

Figures 5A, 5B, 6, 7:
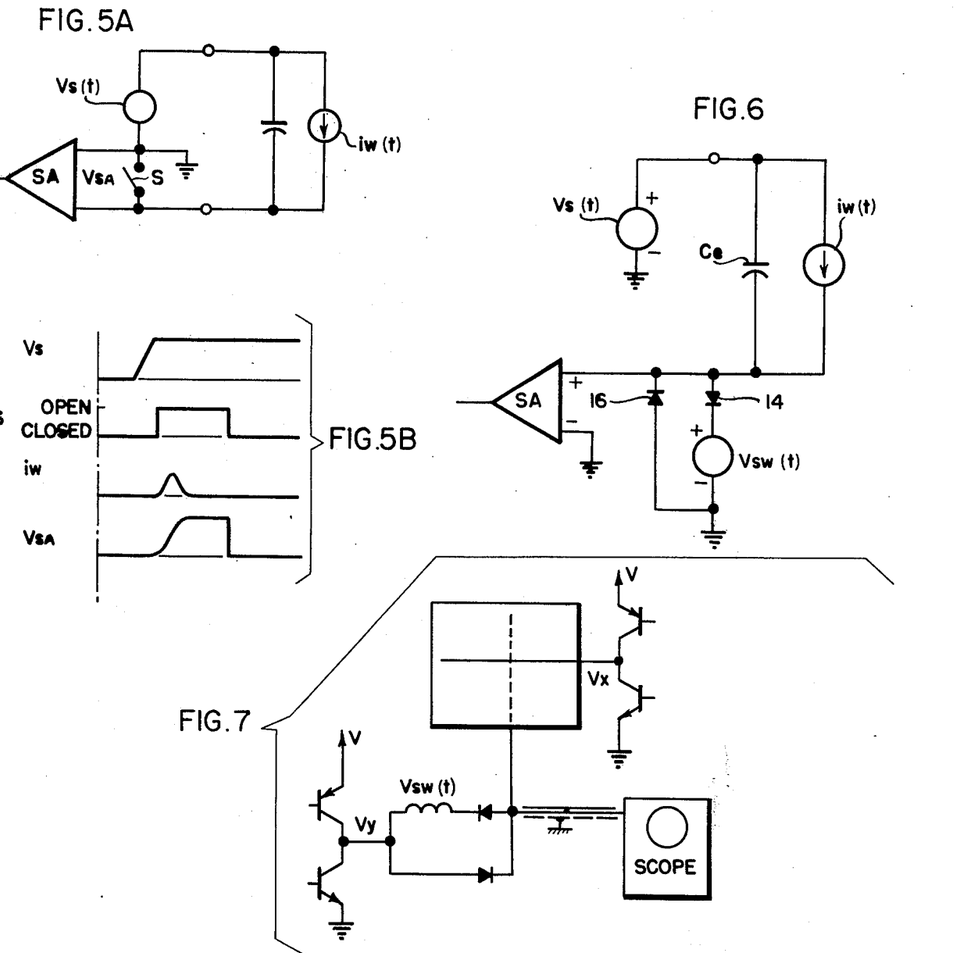
FIGS. 5A, 5B, 6, 7 and 8 illustrate apparatus and corresponding waveforms in accordance with this invention.

The idealized circuit shown in FIG. 5A can be made to function in the manner just described, as shown by the waveforms of FIG. 5B. During the interrogation (or discharge) interval, the switch S is open; during all other times the switch S is closed. The voltage $V_{sa}$ is equal to the change in the capacitor $C_e$ voltage, due to the discharging affects of the discharge current. Since $V_{sa}(t)$ is the integral of the discharge current, $V_{sa}$ is a maximum after the discharge has extinguished itself. The final value of $V_{sa}$ remains the same until the switch S is closed. As a result, the differential voltage can be sampled after the discharge has ceased but before switch S is closed. If the interrogated cell is in the "off" state, then no discharge current would flow during the interrogation interval and thus $V_{sa}$ would remain zero.

Switch S must exhibit several particular characteristics. First, it must switch from "on" to "off" in less than 250 ns. Second, when "closed", it must be able to conduct at least 10 ma with less than a one volt drop. Third, when it is open, it should present an impedance of 100 K ohms or greater. And finally, it must have a very low capacitance since it is effectively in parallel with $C_e$. A parallel combination of $C_s$ and $C_e$ that is considerably larger than $C_e$ alone will significantly reduce the maximum value of $V_{sa}$ because the discharge current now charges both capacitances in parallel, i.e., $V_{sa}(t) = 1/(C_e+C_s) \int i_w(t)dt$.

A practical and simple switch meeting all of the above requirements has been found. FIG. 6 illustrates the circuit used to realize the switch action required. In this circuit the voltage source $V_{sw}(t)$ is a source that is capable of providing either 0 volts or 5 volts which in turn causes the diode 14 to be forward or reverse biased respectively. The diode 14, therefore, performs the desired switching action. The diode specifications are those of commonly available high speed switching diodes. The operation of the circuit is described by the following steps. As the applied voltage $V_s(t)$ rises from 0 to its maximum values, $V_{sw} = 0$ and the capacitive charging current flows through the diode 14 and voltage source $V_{sw}$. Since in this case both the source and the diode 14 exhibit low impedances, the presence of these elements results in a negligible voltage drop during this interval. During the time interval between the occurrence of the capacitive current pulse and the beginning of the gas discharge flow, $V_{sw}$ changes to +5 volts. This action reverse biases the diode 14 and as a result inserts a large resistive impedance into the line. However, if the cell is "on" the discharge current flows into $C_e$, causing a change in the capacitor voltage of approximately 1 volt which in turn appears across the terminals of the sense amplifier SA. If the cell is "off", no gas discharge current flows and in turn no change in the capacitor voltage occurs during the interrogation interval. The output of the sense amplifier is then sampled near the end of the interrogation interval and converted into a digital signal which corresponds to the state of the cell interrogated.

In order to preserve the bi-directional current path that is required during sustain intervals, an additional diode 16 must be added. This diode does not disturb the operation of the switch during the interrogation interval since it is reverse biased at that time.

The voltage source $V_{sw}$ can be realized in a number of embodiments which will provide the high speed, low impedance requirement mentioned previously. The source used in the present description was a low impedance pulse transformer. This source has the advantage of being a "floating" voltage source and therefore not restricted as to where it can appear in the sustain/control drive circuit. The source needs to provide a positive voltage for periods only of approximately 2 microseconds. The "pulse droop" characteristics of the pulse transformer do not interfere with the operation of the switch as long as the diode 14 is reverse biased.

Figure 8:
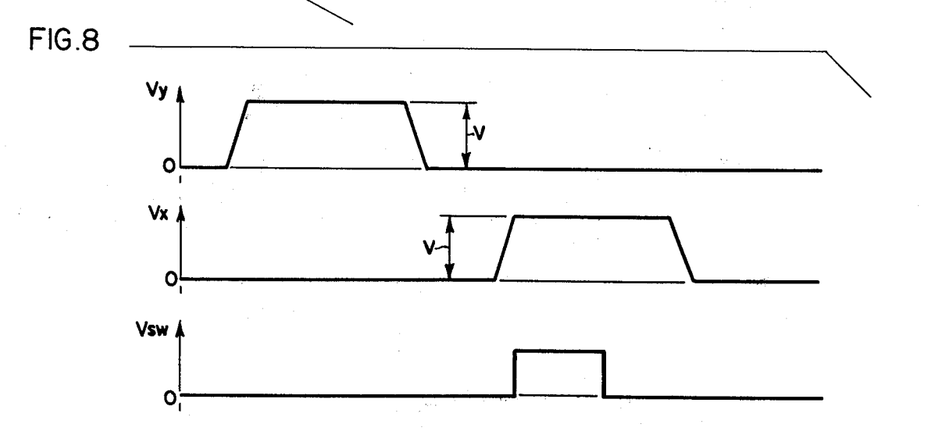

Experimental results have confirmed the feasibility of the scheme just described. The first experimental setup used is shown in FIG. 7. In this case, one cell of a plasma panel was interrogated with the voltage waveform shown in FIG. 8. The voltage measured by the sense amplifier in the case of an "on" cell was easily discernable from an "off" cell.

Figures 9, 10:
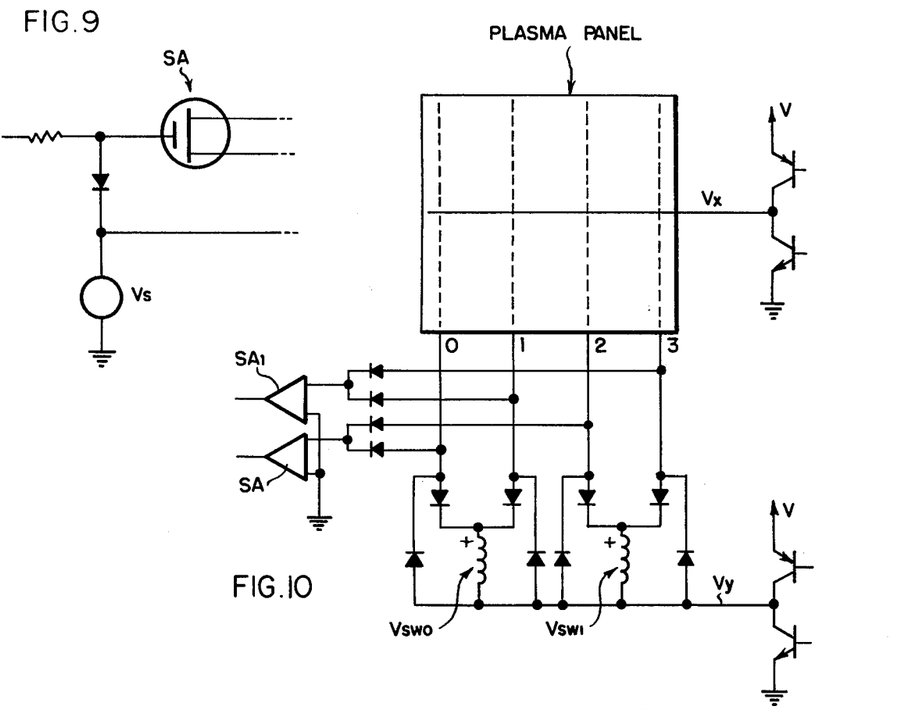
FIG. 9 illustrates an embodiment of a sensing amplifier circuit.
FIGS. 10 and 11 illustrate alternative electrical read-out circuits in accordance with the invention.

The sense amplifier (SA) used in this scheme must exhibit an input resistance of at least 100K ohms and an input capacitance that is much less than 10 pf. The device used in the reported experiments is an MOS field effect transistor and the circuit illustration is shown in FIG. 9. It has been shown that this device can sense the voltage change due to discharge current flow and drive a standard TTL logic element from its output without any intermediate amplification. The MOS FET therefore represents a simple, integratable, sense amplifier that can be used to perform data sensing.

Using the scheme described above, the cells of a 4 × 4 sub-array of a plasma panel were read-out unambiguously and the state of each of the cells indicated at the sense amplifier output was converted into a digital signal appropriate for return to a computer. FIG. 10 illustrates a read-out circuit which allows the use of only two sense amplifiers SA1 and SA2 for four electrodes on the plasma panel, rather than providing a separate sense amplifier for each electrode of one dimension of the panel. The illustrated voltage sources $V_{sw0}$ and $V_{sw1}$ are schematically indicated as coils, it being understood they are secondary windings—the primary windings not being shown.

If $V_{sw0}$ is on and $V_{sw1}$ is off then the state of the cell on line o will appear at SA2 and that of line 1 at SA1. If $V_{sw1}$ is on and $V_{sw0}$ is off, then line 2 will appear at SA2 and line 3 at SA1. Such a system can be expanded as long as the number of sense amplifiers times the number of diode switch voltage sources equals the number of electrodes to be sensed. Thus for a 128 line plasma panel it might be reasonable to have 16 sense amplifiers and 8 voltage sources. This would allow the read-out of 16 bits during one memory cycle.

Figure 11:
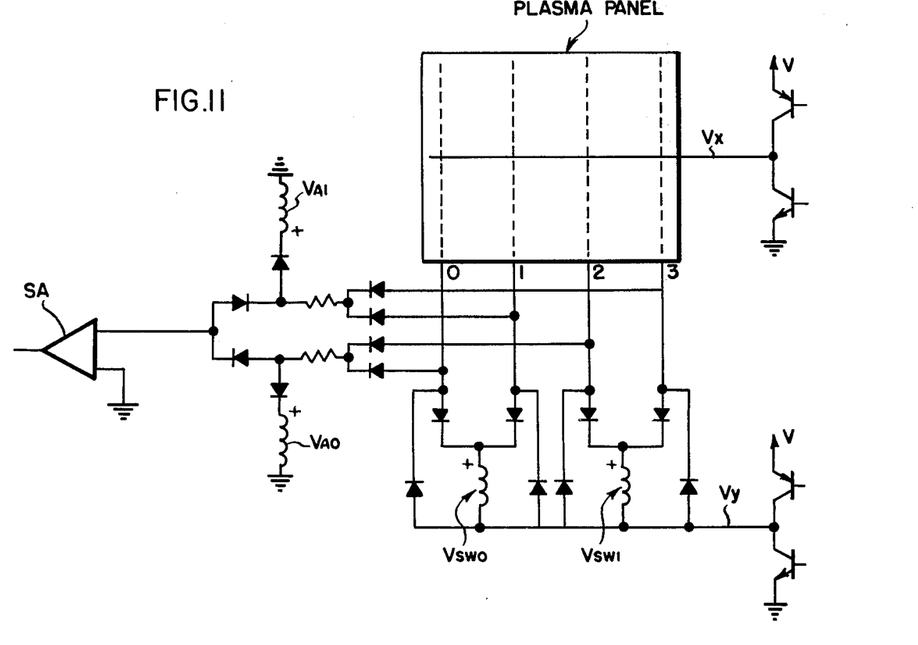

It is possible to further reduce the number of sense amplifiers with addtional switching. FIG. 11 illustrates a read-out circuit having only one sense amplifier. The following table illustrates which line is selected in FIG. 11.

| Sense Line | $V_{sw0}$ | $V_{sw1}$ | $V_{A0}$ | $V_{A1}$ |
|---|---|---|---|---|
| 0 | on | off | on | off |
| 1 | on | off | off | on |
| 2 | off | on | on | off |
| 3 | off | on | off | on |

The diode switches connected to $V_{A0}$ and $V_{A1}$ act both to protect the MOS FET and as selection switches. The resistor connected to the gate of the MOS FET is on the order of 100K. Such an embodiment has been constructed and operated successfully for 16 lines, with one sense amplifier, and 4 voltage sources in each panel dimension.

Figure 12:
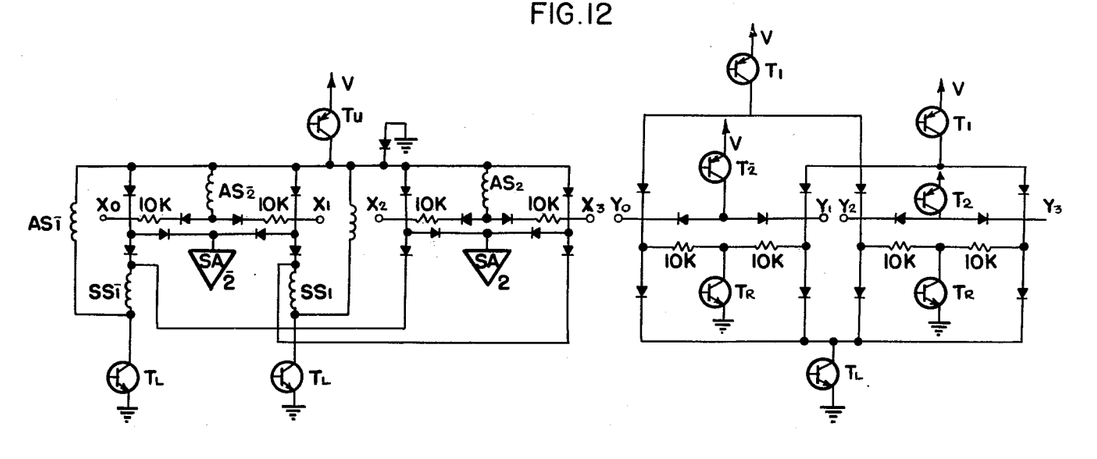
FIG. 12 illustrates driving circuitry for a 4 × 4 plasma panel for electrical read-out as well as the normally required addressing, sustaining and erasing functions.
Figure 13:
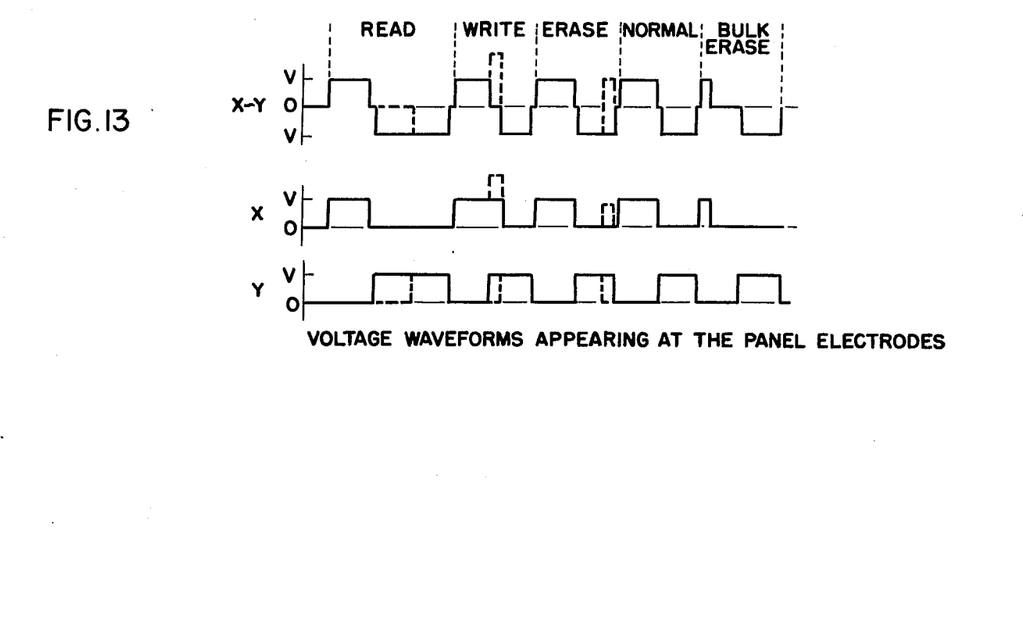
FIG. 13 illustrates a timing diagram showing the voltage appearing across various cells for each function.

To incorporate the above techniques in a low cost design for a large panel, the circuits of FIG. 12 were constructed. FIG. 13 shows the voltage appearing across various cells for each function. FIG. 12 shows the driving circuitry for four X lines and four Y lines of a 16 cell array. Because of the special nature of the read operation, the Y side design departs slightly from conventional design. In addition to providing the sustain voltage to all lines, the Y side has the unusual addressing capability of allowing one line to remain at zero voltage while all others are at V. For instance, if $Y_1$ was to be left low, transistors $T_1$ and $T_2$ would be left off, and all others ($T_1$ and $T_2$) would be turned on. One of the 10K resistors holds the addressed line down, thus requiring that transistors $T_R$ be turned on only during addressing operations. In contrast to conventional diode multiplexing circuitry the Y addressed line is returned to the high voltage through a low impedance transistor instead of the usual 10K resistor. This feature is necessary for the read operation since a large number of cells will discharge after the addressed Y line rises. The resulting large discharge current would cause an undesirable voltage drop across a resistor.

During the read operation, the X side provides the normal sustain pulse by means of transistors $T_u$ and $T_L$. Then all Y lines except one rise to voltage V in order to sustain all cells in the panel except those in the addressed Y line. After all discharge current in the X lines has subsided, the remaining Y line rises to V; then the high impedance switches (represented by the sense secondaries SS and the series diode) open, allowing the states of selected cells in the Y line to be sensed. In order to lower cost, the number of sense amplifiers can be reduced by allowing the sense secondaries and diodes to perform a multiplexing operation as shown in FIG. 12. For instance if $SS_1^-$ is turned off and $SS_1$ is on during the sensing operation, then the sense voltage of $X_1$ will appear at $SA_2^-$ and the voltage of $X_3$ at $SA_2$.

During the write and erase cycles, address pulses are provided on the X side by means of the address secondaries. For instance, if a pulse is desired on $X_2$, secondaries $AS_2$ and $AS_1^-$ are driven, whereas $AS_2^-$ and $AS_1$ remain at zero. Thus the X addressing circuitry is the same as in previous techniques except for the diode in series with the 10K resistor which prevents the resistor from loading the line at the time of sensing.

The circuitry of FIG. 12 has been expanded to drive all lines of a 128 × 128 line plasma panel. This circuitry has 24 address secondaries, 24 Y address transistors, 16 sense secondaries, and 8 sense amplifiers along with 4 diodes and a resistor per line on the X side and 3 diodes and a resistor per line on the Y side. The data rate for writing and erasing was set at 40K bits/sec. For reading with the eight bit parallel output, the rate is about 200K bits/sec. The read operation performs successfully, allowing the Y addressing and sense amplifier multiplexing to select and properly determine the state of all cells in the panel.

The direct electrical read-out of information stored in plasma display panels is especially useful in implementing a remote graphics terminal which allows the user to edit and/or relocate image information on the panel. For example, the terminal user may find it necessary to remove a complex figure or character from one location on the plasma panel and relocate it at another location. Or, the user may need to reduce or increase the scale of image information which cannot otherwise be advantageously displayed, e.g., a graph which is being plotted as the points are being computed.

Figure 14:
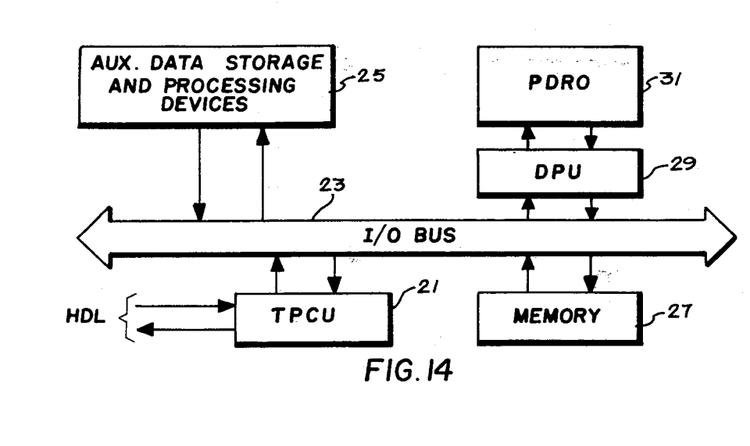
FIG. 14 illustrates in block diagram a system for a remote graphic computer terminal which utilizes electrical interrogation of a plasma panel.

Referring now to FIG. 14, there is shown in block diagram form a graphics system for a remote computer terminal which utilizes direct electrical read-out or interrogation to perform image editing and/or image transfer on a plasma panel. The system includes a terminal processing and control unit (TPCU) 21 which is, for example, coupled to a remote host computer through a host computer system data communication link (HDL). Information and data is transferred between the terminal processing and control unit 21 and other units in the remote terminal through an input/output (I/O) bus 23. Accordingly, information can be transferred to and from auxiliary data storage and processing devices, identified generally at block 35. A memory 27 associated with the terminal control and processing unit 21 is also provided for temporarily storing instructions, data and other information until it is required by other units in the graphics terminal.

As thus far described, the remote graphics terminal of the present invention is similar to the remote terminal described in an article entitled "The PLATO IV Student Terminal", J. Stifle, published in the Proceedings Of The Society For Information Display, Vol. 13, No. 1, First Quarter, 1972.

In the embodiment of the present invention shown in FIG. 14, however, a display processing unit (DPU) 29 is interposed between a plasma display panel with direct electrical read-out (PDRO) 31, such as that described above, and the remainder of the remote graphics computer, i.e., through I/O bus 23. Thus, the image information stored in the plasma panel 31 can be retrieved on a random access basis for subsequent processing such as relocating the image with or without modifications and/or image transfer.

Figure 15:
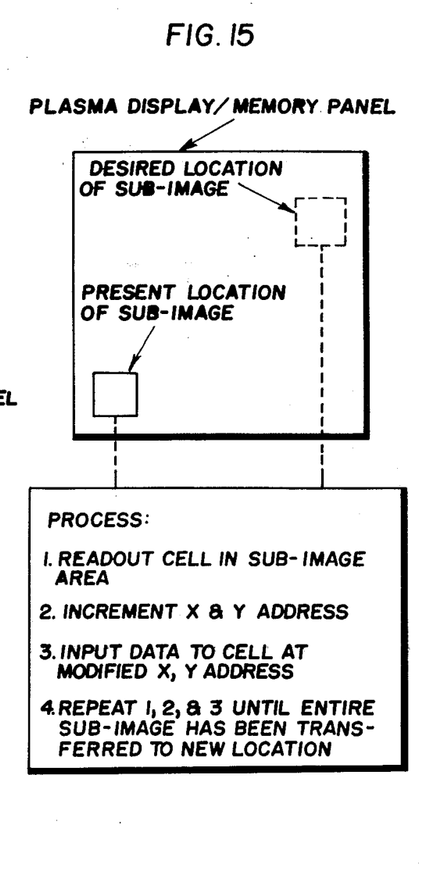
FIG. 15 schematically illustrates the principles of image relocation without modification in accordance with the system of FIG. 14.

As previously mentioned, under certain circumstances, it is desirable to relocate a complex graphical image from its present location on the plasma display panel 31 to a new location without regenerating the points comprising the image or retrieving them from a remote source such as the host computer. FIG. 15 schematically illustrates the principles of image relocation without modification as it is accomplished by the graphics system of the present invention. More particularly, to relocate an image, the user, via the graphics terminal or the host computer, specifies a new address to which the image is to be transferred. The data processing unit 29, under the control of the terminal processing and the control unit 21, successively reads the image information from its present location by direct electrical read-out and replots it at a second location. Consequently, the image at the new location in the plasma panel 31 is an identical copy of the image as it appeared in its original location.

Figure 16:
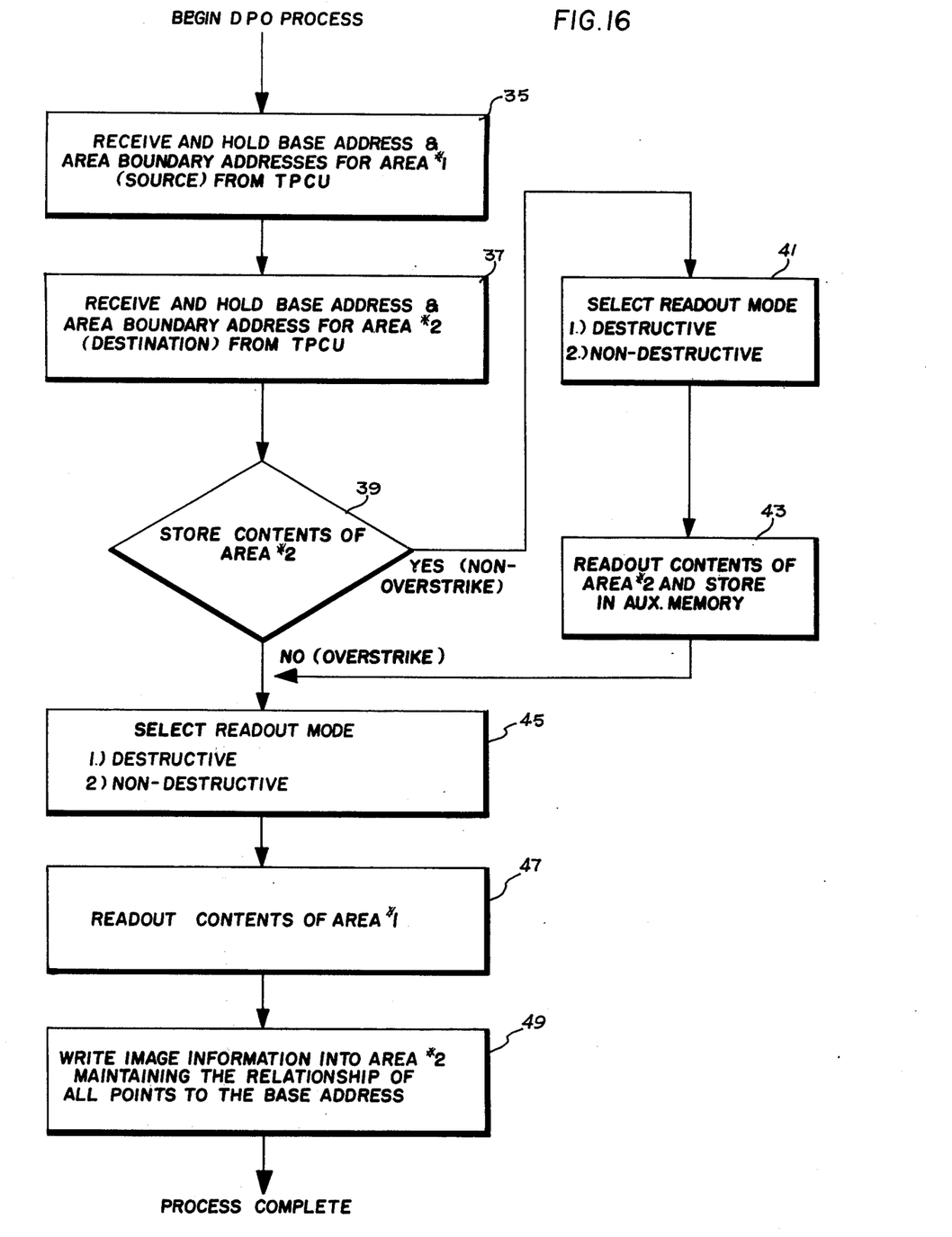
FIG. 16 illustrates a flow diagram showing the steps performed by a data processing system to provide image relocation without modification in accordance with this aspect of the invention.

FIG. 16 illustrates the flow diagram of the steps performed by the data processing unit (DPU) 29 in providing image relocation without modification. There, it may be seen (block 35) that the data processing unit 29, responsive to the terminal processing and control unit 21, initially receives and retains, in storage registers, the base address and the area boundary addresses corresponding to the present or source location (i.e., area 1) of the image information on the plasma panel 31. The base address specifies a particular coordinate in area 1 and the boundary addresses, referenced to the base address define the boundaries of sub-image area (i.e., area 1) which is to be transferred. Subsequently (block 37), the terminal user enters the base address and the area boundary addessess of the new location or destination to (i.e., area 2) to which image is to be transferred by the data processing unit 29.

Since the information initially displayed at area 2 will be overwritten by the image information transferred from the present location (area 1), a decision (block 39) must be made as to whether the overwritten information is to be retained. If it is not to be stored, the process continues on to the operations performed in block 45.

Assuming the image information presently at the destination (area 2) is to be stored, the non-destructive read-out mode (block 41) will be selected if it is intended that the relocated information is to be used simply to modify the information already at that location. That is, the original information at the destination will be retained in the panel 31, but it will also be stored (block 43) in an auxiliary memory. If the information is to be stored, but it is not to be displayed simultaneously with the relocated information, the destructive read-out mode (block 41) will be selected, and the image information will be erased.

The data processing unit 21 then initiates (block 47) the read-out of the image information contained at the source location (area 1). Again, this read-out operation may be destructive or non-destructive (block 45) depending on whether the terminal user desires to retain the information in its original location as well as transferring it to the new location. In either event, the image information at the source location is read-out of the plasma panel 19 (block 49) by the data processing unit 21 and rewritten into the new location (area 2), maintaining the relationship of the rewritten points to the base address at the new location.

Figure 17:
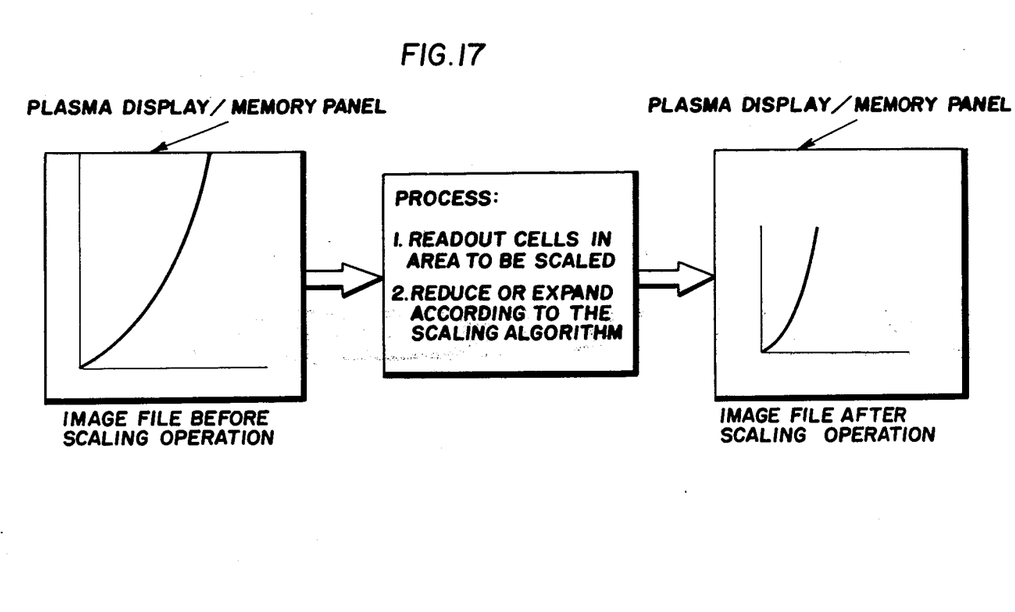
FIG. 17 schematically illustrates the principles of image relocation with modification in accordance with the system of FIG. 14.

As previously mentioned, it is also sometimes desirable to modify the information as it is being relocated, e.g., reduce its scale. FIG. 17 schematically illustrates the principles of image relocation with modification. As in the example shown in FIG. 17, it may be desirable on occasion to reduce (or increase) the scale of a graph being generated as a result of real time computation in the host computer. More particularly, the points of the image are read-out of the plasma panel 31 by the data processing unit 29 and replotted on the panel according to an appropriate scaling algorithm set up in the terminal processing and control unit 21. This process takes place entirely within the remote graphics terminal and does not disturb the computation process taking place within the host computer.

Figure 18:
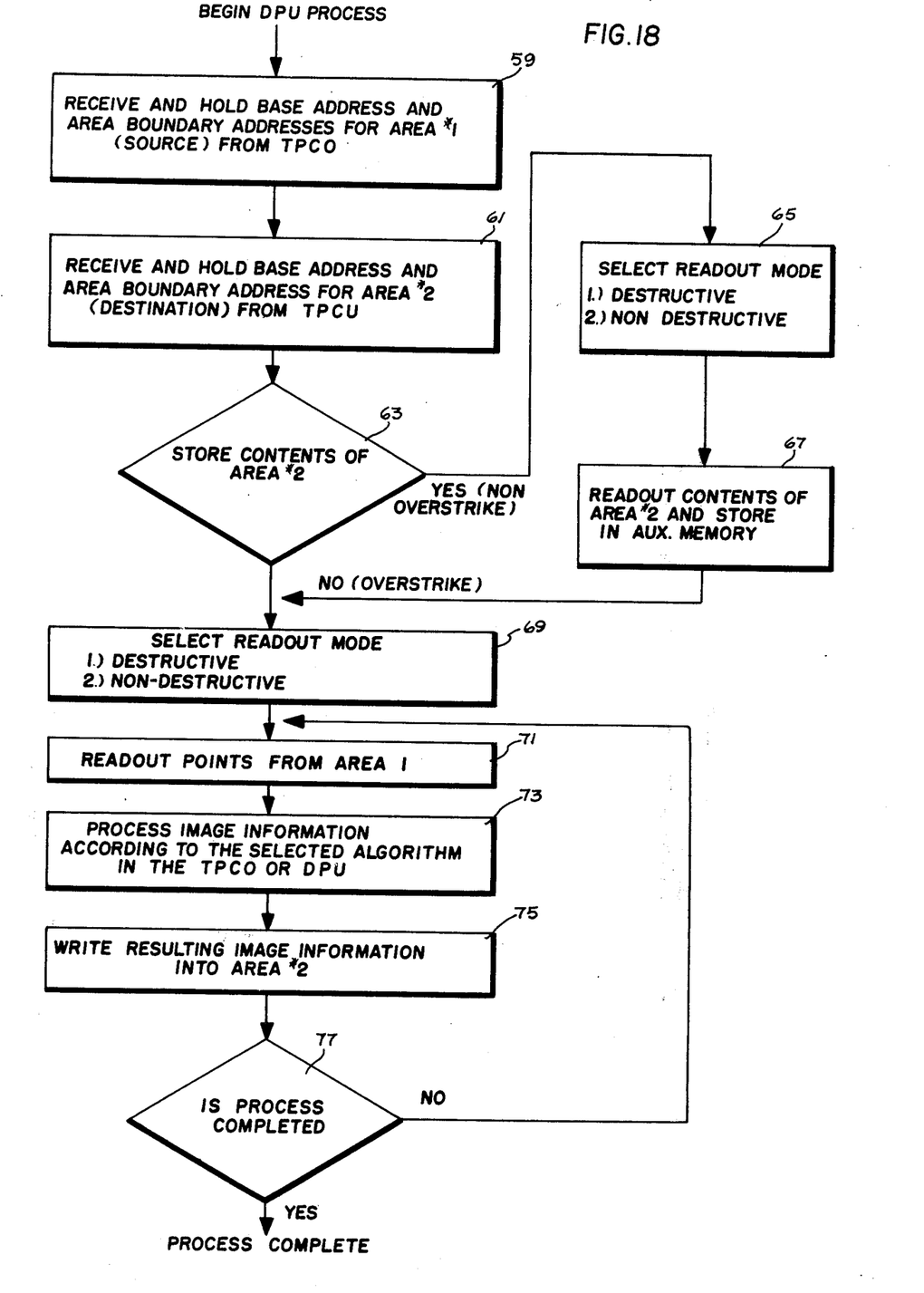
FIG. 18 illustrates a flow diagram showing the steps performed by a data processing system to provide image relocation with modification in accordance with this aspect of the invention.

This process is described in greater detail in FIG. 18 which illustrates a flow diagram showing the steps performed by the data processing unit 29 to provide image relocation with modification. There, the steps performed are similar to those used for relocating the image formation without modifying it. That is, the base address and area boundary addresses corresponding to the original data location (area 1) are loaded (block 59) into the corresponding registers in the data processing unit 29 responsive to the terminal processing and control unit 21. Subsequently, the base address of the destination (area 2) to which the information is to be transferred is likewise loaded (block 61) into the data processing unit 29.

A decision (block 63) is then made by the terminal user whether or not to overstrike the information stored at the destination, and if so, whether it is to be destructive or non-destructive read-out (block 65) before storing the information (block 67).

Subsequently, the data processing unit 29 reads the data (block 71) from the source location (area 1) in a destructive or non-destructive mode (block 69), as determined by the terminal user, and processes the points read from original location according to the selected algorithm (block 73), e.g., scale reduction. The resulting modified image information is then written (block 75) into the destination location (area 2). This process continues (block 77) until the image information is processed according to one or more algorithms and relocated as desired.

It should be noted, however, that although the present example has been taken in the context of reducing the scale of the image information to be transferred, the method is equally applicable to increasing the scale of the information or, for example, rotating the information relative to its original location. Any desired modification can be made by merely changing the algorithm of the terminal processing and control unit 21.

The information handling capabilities of a graphics terminal is greatly enhanced if data can be transferred directly from the plasma display panel 31 to other information storage or processing units. For example, it may be desirable to transfer the image information to a dot matrix hardcopy printer, to other plasma display panels, and/or to other special purpose storage or processing units.

Figure 19:
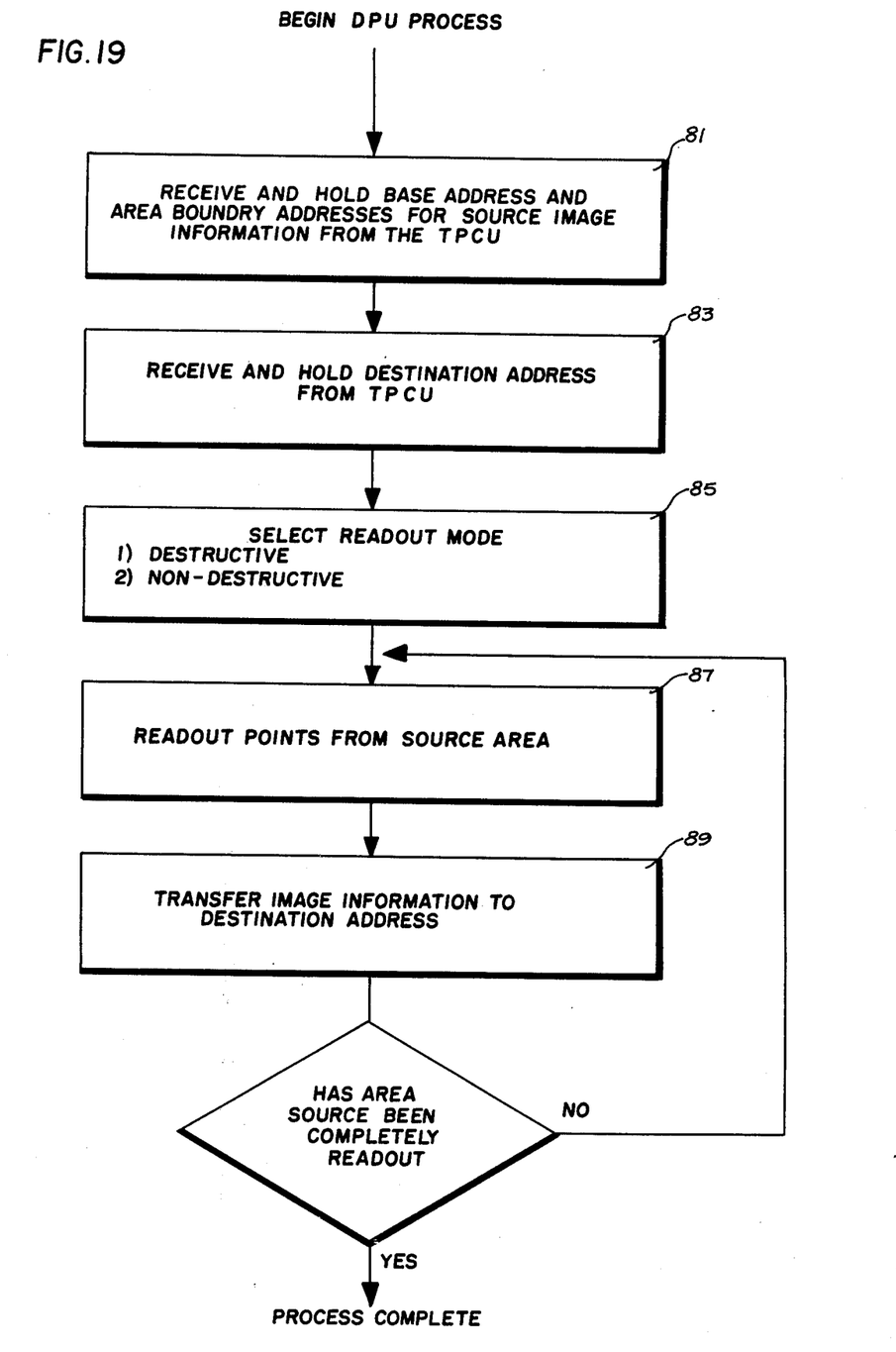
FIG. 19 illustrates a flow diagram showing the steps performed by a data processing system to provide image transfer in accordance with this aspect of the invention.

Accordingly, FIG. 19 illustrates a flow diagram showing the steps performed by the data processing unit 29 in transferring image information to external devices. Initially, the terminal processing and control unit 21 transmits the base address and area boundary addresses (block 81) corresponding to the image information that is to be transferred to the data processing unit (DPU) 29. The destination address of the information is then applied to the data processing unit 29 by the terminal processing and control unit 21 (block 83). The terminal user selects either the destructive or non-destructive read-out mode (block 85), and subsequently, the points from the source area are read-out (block 87) and transferred to the particular location in the graphics terminal corresponding to the destination address (block 89). These steps are repeated (block 91) until the image information at the source location (area 1) has been completely read-out.

The foregoing detailed description has been given for clearness of understanding only, and no unnecessary limitations should be understood therefrom as modifications will be obvious to those skilled in the art.

What is claimed is:

1. A method for electronically sensing the state of a gaseous discharge cell comprising:
   applying a sustaining signal sufficient to discharge a gaseous discharge cell in an "on" state and thereby provide a discharge current but not sufficient to discharge a gaseous discharge cell in an "off" state, said discharge current being time delayed relative to the application of said sustaining signal to said gaseous discharge cell;
   integrating said discharge current;
   sensing said discharge current only during a sensing interval initiated substantially coincident with the interval when said discharge current would be provided and continuing beyond said discharge current interval for a predetermined time; and
   sampling said integrated discharge current after said discharge current interval has ended but during said sensing interval to provide an output indicative of the state of said cell.

2. A method for sensing the state of a gaseous discharge cell as claimed in claim 1, wherein said applying a sustaining signal comprises applying a square-wave sustaining signal to said cell.

3. Apparatus for electronically sensing the state of a gaseous discharge cell which can be selectively discharged when in the "on" state to provide a discharge current in response to a sustaining signal applied to said gaseous discharge cell, said discharge current being time delayed relative to the application of said sustaining signal to said gaseous discharge cell, said apparatus comprising:
   means for integrating said discharge current;
   an impedance element;
   coupling means for selectively coupling said impedance element to said gaseous discharge cell to sense said integrated discharge current only during a sensing interval initiated substantially coincident with the interval when said discharge current would be provided and continuing beyond said discharge current interval for a predetermined time; and means for sampling said integrated discharge current after said discharge current interval has ended but during said sensing interval to provide an output indicative of whether said gaseous discharge cell is in the "on" state.

4. Apparatus as claimed in claim 3, wherein said impedance element comprises a resistor, and said coupling means includes switching means selectively coupling said discharge current to said resistor only during said sensing interval.

5. A method for relocating image information from a first location in a plasma panel comprising a plurality of gaseous discharge cells to a second location in said plasma panel, said method comprising:

electrically interrogating said plasma panel to readout the information stored at the first location, said electrically interrogating including:
 a. applying a signal sufficient to discharge said gaseous discharge cells at the first location and thereby provide discharge currents, said discharge current being time delayed relative to the application of said signal to the corresponding one of said gaseous discharge cells,
 b. integrating said discharge current,
 c. sensing said integrated discharge current only during a sensing interval initiated substantially coincident with the interval when said discharge current would be provided and continuing beyond said discharge current interval for a predetermined time,
 d. sampling said integrated discharge current during said sensing interval to provide an output indicative of the state of said gaseous discharge cell, said sampling outputs of the plurality of said gaseous discharge cells comprising the first location in said plasma panel corresponding to the image information stored at the first location; and writing the information into said gaseous discharge cells at the second location in said plasma panel.

6. Apparatus as claimed in claim 3, wherein said sustaining signal is a square-wave sustaining signal.

7. A method as claimed in claim 5, including the additional steps of determining the address of the first location, determining the address of the second location, and addressing the first location before electrically interrogating said gaseous discharge cells at the first location and further including addressing the second location before writing the information into the second location.

8. A method as claimed in claim 7, including storing the image information originally located at the second location before the information from the first location is relocated therein.

9. A method as claimed in claim 7, wherein said addressing comprises simultaneously incrementing the address corresponding to the first location and the address corresponding to the second location to sequentially electrically interrogate said gaseous discharge cells at the first location and write the information into the corresponding ones of said gaseous discharge cells at the second location.

10. A method as claimed in claim 5, wherein said applying a signal comprises applying a sustaining signal sufficient to discharge those of said gaseous discharge cells in an "on" state at the first location but not sufficient to discharge those of said gaseous discharge cells in an "off" state and wherein said sampling said integrated discharge current is limited to the portion of said sensing interval after said discharge current interval has ended.

11. A method as claimed in claim 10, wherein said applying a sustaining signal comprises applying a square-wave sustaining signal to said gaseous discharge cell.

12. A method for modifying and relocating image information from a first location in a plasma panel comprising a plurality of gaseous discharge cells to a second location in said plasma panel, said method comprising:

electrically interrogating said plasma panel to readout the information stored at the first location, said electrically interrogating including:
 a. applying a signal sufficient to discharge said gaseous discharge cells at the first location and thereby provide discharge currents, said discharge current being time delayed relative to the application of said signal to the corresponding one of said gaseous discharge cells,
 b. integrating said discharge current,
 c. sensing said integrated discharge current only during a sensing interval initiated substantially coincident with the interval when said discharge current would be provided and continuing beyond said discharge current interval for a predetermined time,
 d. sampling said integrated discharge current after said discharge current interval but during said sensing interval to provide an output indicative of the state of said gaseous discharge cell, said sampling outputs of the plurality of said gaseous discharge cells comprising the first location in said plasma panel corresponding to the image information stored at the first location;

modifying the image information according to a selected algorithm; and writing the information into said plasma panel at the second location.

13. A method as claimed in claim 12, including the additional steps of determining the address of the first location, determining the address of the second location, and addressing the first location before electrically interrogating said gaseous discharge cells at the first location and further including addressing the second location before writing the information into the second location.

14. A method as claimed in claim 13, wherein the modifying algorithm changes the scale of the information electrically interrogated from the first location before the information is written into the second location.

15. A method as claimed in claim 13, including storing the image information originally located at the second location before the information from the first location is relocated therein.

16. A method as claimed in claim 13, wherein said addressing comprises simultaneously incrementing the address corresponding to the first location and the address corresponding to the second location to sequentially electrically interrogate said gaseous discharge cells at the first location and write the image information into the corresponding ones of said gaseous discharge cells at the second location.

17. A method as claimed in claim 12, wherein said applying a signal comprises applying a sustaining signal sufficient to discharge those of said gaseous discharge cells in an "on" state at the first location but not sufficient to discharge those of said gaseous discharge cells in an "off" state and wherein said sampling said integrated discharge current is limited to the portion of said sensing interval after said discharge current interval has ended.

18. A method as claimed in claim 17, wherein said applying a sustaining signal comprises applying a square-wave sustaining signal to said gaseous discharge cell.

19. A method for transferring image information from a plasma panel comprising a plurality of gaseous discharge cells to an auxiliary storage unit, said method comprising:
electrically interrogating said plasma panel to read-out the information stored at a particular location in said plasma panel, said electrically interrogating including:
 a. applying a signal sufficient to discharge said gaseous discharge cells at the particular location and thereby provide discharge currents, said discharge current being time delayed relative to the application of said signal to the corresponding one of said gaseous discharge cells,
 b. integrating said discharge current,
 c. sensing said integrated discharge current only during a sensing interval initiated substantially coincident with the interval when said discharge current would be provided and continuing beyond said discharge current interval for a predetermined time,
 d. sampling said integrated discharge current during said sensing interval to provide an output indicative of the state of said gaseous discharge cell, said sampling outputs of the plurality of said gaseous discharge cells comprising the particular location in said plasma panel corresponding to the image information stored at the particular location; and
transferring the information into said auxiliary storage unit.

20. A method as claimed in claim 19, wherein said auxiliary storage unit comprises a plurality of memory devices and including the additional steps of determining the address of the particular location in said plasma panel, determining the address of said corresponding memory devices in said auxiliary storage unit, and addressing the particular location in said plasma panel before electrically interrogating said gaseous discharge cells at the particular location in said plasma panel and further including addressing said corresponding memory devices in said auxiliary storage unit before transferring the information to said auxiliary storage unit.

21. A method as claimed in claim 20, wherein said auxiliary storage unit comprises a second plasma panel.

22. A method as claimed in claim 19, wherein said applying a signal comprises applying a sustaining signal sufficient to discharge those of said gaseous discharge cells in an "on" state at the first location but not sufficient to discharge those of said gaseous discharge cells in an "off" state and wherein said sampling said integrated discharge current is limited to the portion of said sensing interval after said discharge current interval has ended.

23. A method as claimed in claim 22, wherein said applying a sustaining signal comprises applying a square-wave sustaining signal to said gaseous discharge cell.

24. In a graphics terminal having image information stored at a first location in a plasma panel comprising a plurality of gaseous discharge cells, apparatus comprising:
means for electrically interrogating said plasma panel to read-out the information stored at the first location, said interrogating means including:
 a. means for applying a signal sufficient to discharge said gaseous discharge cells at the first location and thereby provide discharge currents, said discharge current being time delayed relative to the application of said signal to the corresponding one of said gaseous discharge cells,
 b. means for integrating said discharge current,
 c. means for sensing said integrated discharge current only during a sensing interval initiated substantially coincident with the interval when said discharge current would be provided and continuing beyond said discharge current interval for a predetermined time,
 d. means for sampling said integrated discharge current during said sensing interval to provide an output indicative of the state of said gaseous discharge cell, said sampling outputs of the plurality of said gaseous discharge cells comprising the first location in said plasma panel corresponding to the image information stored at the first location; and
display processing means for writing the information into said gaseous discharge cells at a second location in said plasma panel.

25. Apparatus as claimed in claim 24, including means for determining the address of the first location and for determining the address of the second location and means for addressing the first location before electrically interrogating said gaseous discharge cells at the first location and for addressing the second location before writing the information into the second location.

26. Apparatus as claimed in claim 25, wherein said addressing means includes means for simultaneously incrementing the address corresponding to the first location and the address corresponding to the second location, said addressing means facilitating the sequential electrical interrogation of said gaseous discharge cells at the first location to write the information into the corresponding ones of said gaseous discharge cells at the second location.

27. Apparatus as claimed in claim 26, including means storing the image information originally located at the second location before the information from the first location is relocated therein.

28. Apparatus as claimed in claim 24, wherein said signal applying means comprises means for applying a sustaining signal sufficient to discharge those of said gaseous discharge cells in an "on" state at the first location but not sufficient to discharge those of said gaseous discharge cells in an "off" state and wherein said sampling means includes means for enabling said sampling means only during the portion of said sensing interval after said discharge current interval has ended.

29. Apparatus as claimed in claim 28, wherein said means for applying a sustaining signal comprises means for applying a square-wave sustaining signal to said gaseous discharge cell.

30. In a graphics terminal having image information stored at a first location in a plasma panel comprising a plurality of gaseous discharge cells, apparatus comprising:
- means for electrically interrogating said plasma panel to read-out the information stored at the first location, said interrogating means including:
  a. means for applying a signal sufficient to discharge said gaseous discharge cells at the first location and thereby provide discharge currents, said discharge current being time delayed relative to the application of said signal to the corresponding one of said gaseous discharge cells,
  b. means for integrating said discharge current,
  c. means for sensing said integrated discharge current only during a sensing interval initiated substantially coincident with the interval when said discharge current would be provided and continuing beyond said discharge current interval for a predetermined time,
  d. means for sampling said integrated discharge current after said discharge current interval but during said sensing interval to provide an output indicative of the state of said gaseous discharge cell, said sampling outputs of the plurality of said gaseous discharge cells comprising the first location in said plasma panel corresponding to the image information stored at the first location; and
- display processing means including means for modifying the image information according to a selected algorithm and means for writing the modified information into said plasma panel at a second location.

31. Apparatus as claimed in claim 30, including means for determining the address of the first location and for determining the address of the second location and means for addressing the first location before electrically interrogating said gaseous discharge cells at the first location and for addressing the second location before writing the information into the second location.

32. Apparatus as claimed in claim 31, wherein said addressing means includes means for simultaneously incrementing the address corresponding to the first location and the address corresponding to the second location, said addressing means facilitating the sequential electrical interrogation of said gaseous discharge cells at the first location to write the information into the corresponding ones of said gaseous discharge cells at the second location.

33. Apparatus as claimed in claim 30, wherein said modifying means changes the scale of the information electrically interrogated from the first location before the information is written into the second location.

34. Apparatus as claimed in claim 30, including means for storing the image information originally located at the second location before the information from the first location is relocated therein.

35. Apparatus as claimed in claim 30, wherein said signal applying means comprises means for applying a sustaining signal sufficient to discharge those of said gaseous discharge cells in an "on" state at the first location but not sufficient to discharge those of said gaseous discharge cells in an "off" state and wherein said sampling means includes means for enabling said sampling means only during the portion of said sensing interval after said discharge current interval has ended.

36. Apparatus as claimed in claim 35, wherein said means for applying a sustaining signal comprises means for applying a square-wave sustaining signal to said gaseous discharge cell.

37. In a graphics terminal having image information stored in a plasma panel comprising a plurality of gaseous discharge cells, apparatus comprising:
- means for electrically interrogating said plasma panel to read-out the information stored at a particular location in said plasma panel, said electrically interrogating including:
  a. means for applying a signal sufficient to discharge said gaseous discharge cells at the particular location and thereby provide discharge currents, said discharge current being time delayed relative to the application of said signal to the corresponding one of said gaseous discharge cells,
  b. means for integrating said discharge current,
  c. means for sensing said integrated discharge current only during a sensing interval initiated substantially coincident with the interval when said discharge current would be provided and continuing beyond said discharge current interval for a predetermined time,
  d. means for sampling said integrated discharge current during said sensing interval to provide an output indicative of the state of said gaseous discharge cell, said sampling outputs of the plurality of said gaseous discharge cells comprising the particular location in said plasma panel corresponding to the image information stored at the particular location;
- an auxiliary storage unit; and
- display processing means for transferring the image information into said auxiliary storage unit.

38. Apparatus as claimed in claim 37, wherein said auxiliary storage unit comprises a plurality of memory devices and including means for determining the address of the particular location in said plasma panel and for determining the address of said corresponding memory devices in said auxiliary storage unit and means for addressing the particular location in said plasma panel before electrically interrogating said gaseous discharge cells at the particular location in said plasma panel and for addressing said corresponding memory devices in said auxiliary storage unit before transferring the information to said auxiliary storage unit.

39. Apparatus as claimed in claim 37, wherein said auxiliary storage unit comprises a second plasma panel.

40. Apparatus as claimed in claim 37, wherein said signal applying means comprises means for applying a sustaining signal sufficient to discharge those of said gaseous discharge cells in an "on" state at the first location but not sufficient to discharge those of said gaseous discharge cells in an "off" state and wherein said sampling means includes means for enabling said sampling means only during the portion of said sensing interval after said discharge current interval has ended.

41. Apparatus as claimed in claim 40, wherein said means for applying a sustaining signal comprises means for applying a square-wave sustaining signal to said gaseous discharge cell.

42. A method for electronically sensing the state of a gaseous discharge cell comprising:
- applying a signal sufficient to discharge said gaseous discharge cell and thereby provide a discharge current, said discharge current being time delayed relative to the application of said signal to said gaseous discharge cell;
- integrating said discharge current;
- sensing said integrated discharge current only during a sensing interval initiated substantially coincident with the interval when said discharge current would be provided and continuing beyond said discharge current interval for a predetermined time; and sampling said integrated discharge current during said sensing interval to provide an output indicative of the state of said gaseous discharge cell.

43. A method as claimed in claim 42, wherein said sampling of said integrated discharge current occurs after said discharge current interval has ended but during said sensing interval.

44. A method as claimed in claim 42, wherein said sensing comprises selectively coupling a sensing impedance element to said gaseous discharge cell only during said sensing interval for responding to said discharge current and providing an output indicative of the state of said gaseous discharge cell.

45. Apparatus for electronically sensing the state of a gaseous discharge cell which can be selectively discharged to provide a discharge current, said apparatus comprising:

means for integrating said discharge current;
an impedance element;
coupling means for selectively coupling said impedance element to said gaseous discharge cell to sense said integrated discharge current only during a sensing interval initiated substantially coincident with the interval when said discharge current would be provided and continuing beyond said discharge current interval for a predetermined time; and
means for sampling said integrated discharge current to provide an output indicative of the state of said gaseous discharge cell.

46. Apparatus as claimed in claim 45, wherein said sampling means includes means for sampling said integrated discharge current after said discharge current interval has ended but during said sensing interval.

47. In a plasma panel having an array of gaseous discharge cells exhibiting inter-electrode capacitances, said cells providing a discharge current in a sustaining sequence only when in the "on" state, apparatus for electronically sensing the state of said gaseous discharge cells comprising:

means for applying a sustaining signal sufficient to discharge said gaseous discharge cell in an "on" state and thereby provide a discharge current but not sufficient to discharge a gaseous discharge cell in an "off" state, said discharge current being time delayed relative to the application of said sustaining signal to said gaseous discharge cell;

a diode and a voltage source coupled in series between said gaseous discharge cell and a reference potential, said voltage source selectively switching said diode between a forward-biased condition and a reverse-biased condition, said diode having a low impedance when in the forward-biased condition and a higher impedance when in the reverse-biased condition, said inter-electrode capacitance causing said discharge current to be integrated during the interval when said diode is in the reverse-biased condition;

sensing amplifier means selectively coupled to said gaseous discharge cell for sensing said integrated discharge current when said diode is in the reverse-biased condition and providing an output signal representative of said integrated discharge current;

means for controlling said voltage source to selectively switch said diode between the forward-biased condition and the reverse-biased condition to determine a sensing interval during which said sensing amplifier means is enabled to sense said integrated discharge current, said sensing interval being initiated substantially coincident with the interval when said discharge current is present and continuing beyond said discharge current interval for a predetermined time; and means for sampling said sensing amplifier output signal near the end of said sensing interval to derive an output signal corresponding to the state of said gaseous discharge cell.

48. Apparatus as claimed in claim 47, including a second diode coupled in parallel with the first of said diodes and said voltage source and in opposing polarity with said first diode to provide a bi-directional current path during application of said sustaining signal.

49. Apparatus as claimed in claim 47, wherein said voltage source comprises the secondary winding of a low impedance pulse transformer.

* * * * *